United States Patent
Takemura et al.

(10) Patent No.: US 10,499,542 B2
(45) Date of Patent: Dec. 3, 2019

(54) COOLING JACKET AND ELECTRONIC APPARATUS

(71) Applicant: FUJITSU LIMITED, Kawasaki-shi, Kanagawa (JP)

(72) Inventors: Keizou Takemura, Kawasaki (JP); Jie Wei, Hachioji (JP); Masumi Suzuki, Kawasaki (JP); Michimasa Aoki, Kawasaki (JP); Mitsutaka Yamada, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/171,835

(22) Filed: Oct. 26, 2018

(65) Prior Publication Data

US 2019/0166720 A1    May 30, 2019

(30) Foreign Application Priority Data

Nov. 30, 2017    (JP) .................. 2017-230608

(51) Int. Cl.
*H05K 7/00*    (2006.01)
*H05K 7/20*    (2006.01)

(52) U.S. Cl.
CPC ..... *H05K 7/20263* (2013.01); *H05K 7/20254* (2013.01)

(58) Field of Classification Search
CPC .............. H05K 7/20263; H05K 7/20254
USPC .......................................... 361/699; 257/706
See application file for complete search history.

(56) References Cited

U.S. PATENT DOCUMENTS

| 8,627,567 | B2* | 1/2014 | Seo ................... | B23K 20/1265 |
| | | | | 29/890.03 |
| 9,237,676 | B2* | 1/2016 | Gohara ............... | H01L 23/3735 |
| 9,530,713 | B2* | 12/2016 | Yamada .............. | H01L 23/3114 |
| 9,562,728 | B2* | 2/2017 | Gotou ................. | H01L 23/473 |
| 9,673,130 | B2* | 6/2017 | Gohara ............... | H01L 23/473 |
| 9,722,050 | B2* | 8/2017 | Li ..................... | H01L 29/41791 |
| 10,214,109 | B2* | 2/2019 | Gohara ............... | H01L 23/473 |
| 2005/0180106 | A1* | 8/2005 | Ohashi ............... | F28F 1/22 |
| | | | | 361/699 |
| 2008/0216991 | A1 | 9/2008 | Oikawa | |
| 2009/0065178 | A1* | 3/2009 | Kasezawa ........... | H01L 23/473 |
| | | | | 165/104.19 |
| 2010/0002397 | A1* | 1/2010 | Toh .................... | H01L 23/4006 |
| | | | | 361/713 |
| 2012/0139096 | A1* | 6/2012 | Gohara ............... | H01L 23/3735 |
| | | | | 257/706 |
| 2012/0279761 | A1* | 11/2012 | Hori ................... | H01L 21/4878 |
| | | | | 174/252 |

(Continued)

FOREIGN PATENT DOCUMENTS

JP    2011-223019    11/2011

*Primary Examiner* — William H. Mayo, III
(74) *Attorney, Agent, or Firm* — Fujitsu Patent Center

(57) ABSTRACT

A cooling jacket includes, a base having a portion that is in contact with a heat generating component, a plurality of grooves formed on a surface of the base, each of the plurality of grooves that is arranged in parallel each other, and a cover that is in contact with an upper end of each of fins formed by the plurality of grooves on the same plane as the surface of the base. Each of the plurality of grooves has curved bottom surfaces provided in both end portions thereof, and is shallower toward the end portions thereof. The cover is bonded to the base in a state of covering all of the plurality of grooves.

6 Claims, 14 Drawing Sheets

(56) References Cited

U.S. PATENT DOCUMENTS

2014/0054762 A1\* 2/2014 Nagaune ............... H01L 23/473
257/714

\* cited by examiner

COOLING JACKET AND ELECTRONIC APPARATUS

CROSS-REFERENCE TO RELATED APPLICATION

This application is based upon and claims the benefit of priority of the prior Japanese Patent Application No. 2017-230608, filed on Nov. 30, 2017, the entire contents of which are incorporated herein by reference.

FIELD

The embodiments discussed herein are related to a cooling jacket and an electronic apparatus.

BACKGROUND

Electronic apparatuses include various heat generating components. For example, an electronic apparatus such as a server, a supercomputer, or a personal computer includes a heat generating component such as, for example, a central processing unit (CPU) or a graphics processing unit (GPU). In order to prevent an overheating of the heat generating component, various cooling mechanisms are used for heat dissipation from the heat generating component.

Related techniques are disclosed in, for example, Japanese Laid-open Patent Publication No. 2011-223019.

SUMMARY

According to an aspect of the embodiments, a cooling jacket includes, a base having a portion that is in contact with a heat generating component, a plurality of grooves formed on a surface of the base, each of the plurality of grooves that is arranged in parallel each other, and a cover that is in contact with an upper end of each of fins formed by the plurality of grooves on the same plane as the surface of the base. Each of the plurality of grooves has curved bottom surfaces provided in both end portions thereof, and is shallower toward the end portions thereof. The cover is bonded to the base in a state of covering all of the plurality of grooves.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In order to effectively cool a heat generating component of an electronic apparatus using a cooling mechanism of liquid cooling, it is conceivable to cause a portion of a cooling jacket, in contact with the heat generating component, to be thinned and made a portion in which a liquid coolant circulates, with the heat generating component as close as possible. However, when the portion of the cooling jacket in contact with the heat generating component is thinned, there is a possibility that the cooling jacket becomes insufficient in strength.

Hereinafter, an embodiment will be described. The following embodiment is merely given by way of example, and the technical scope of the present disclosure is not limited to the following embodiment.

Figure 1:
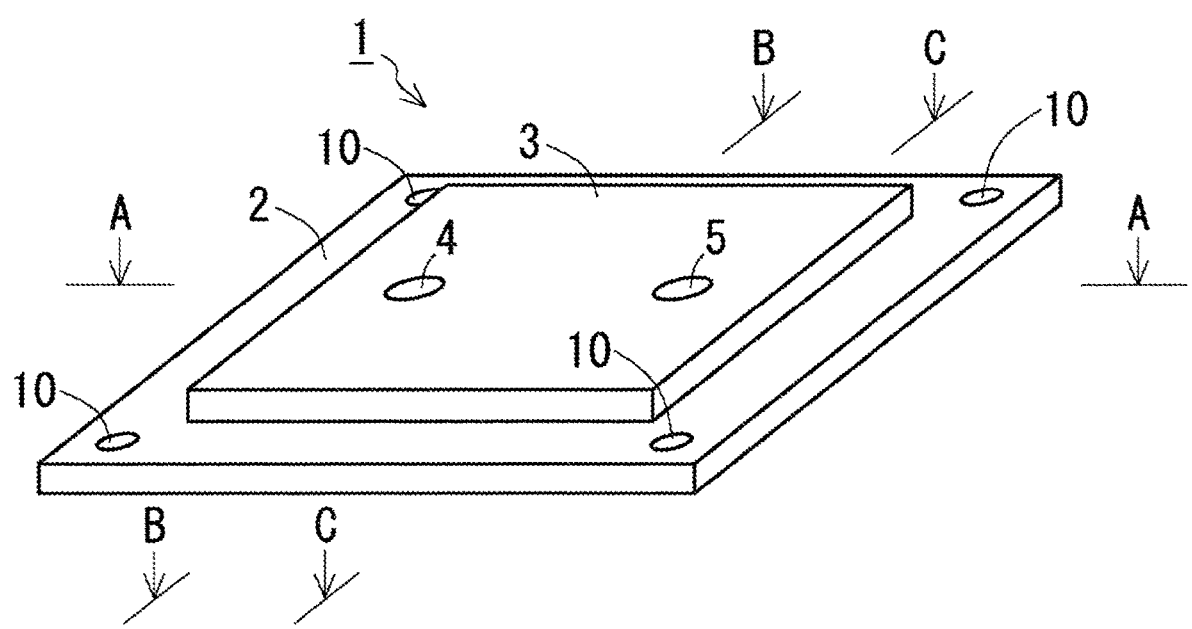
FIG. 1 is a view illustrating a cooling jacket according to an embodiment.

FIG. 1 is a view illustrating a cooling jacket according to an embodiment. The cooling jacket 1 is a cooling component that may be attached to a heat generating component of a server, a supercomputer, or any of various electronic apparatuses. The heat generating component to which the cooling jacket 1 is attached may be, for example, a central processing unit (CPU), a graphics processing unit (GPU), or any of various heat generating components.

The cooling jacket 1 includes a base 2 configured to form a portion that is in contact with a heat generating component and a cover 3 bonded to the base 2. The base 2 is a plate-shaped member that is attachable to the surface of the heat generating component. Mounting holes 10 are formed at four corners of the base 2. In addition, the cover 3 is a plate-shaped member bonded to the surface of the base 2. The surface of the cover 3 is provided with an inlet 4 and an outlet 5 through which a liquid coolant circulates. A coolant pipe of a device that circulates the coolant is connected to the inlet 4 and the outlet 5, respectively. The coolant introduced into the cooling jacket 1 from the inlet 4 passes through the inside of the cooling jacket 1 and is discharged from the outlet 5. In order to efficiently dissipate heat of the heat generating component, the base 2 and the cover 3 are formed of a material having good thermal conductivity. A material that may be applied as the material of the base 2 and the cover 3 may be, for example, copper or aluminum.

Figure 2:
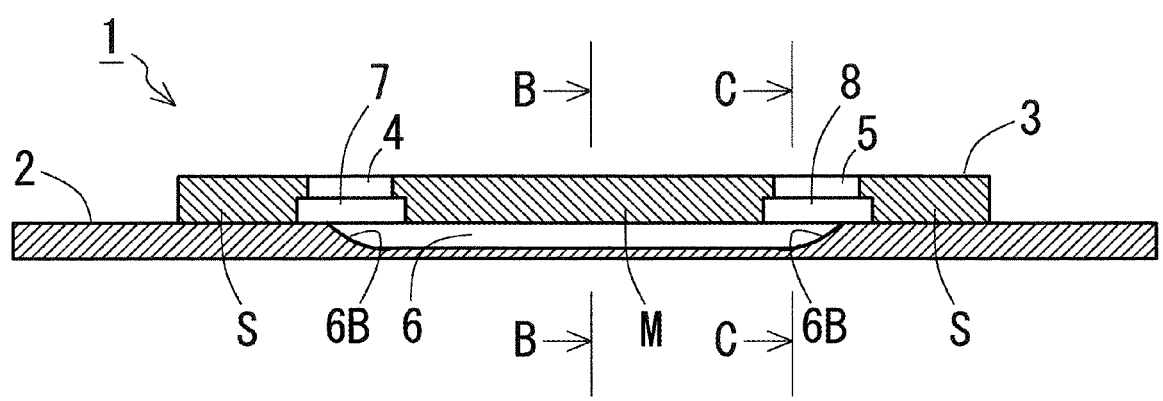
FIG. 2 is a cross-sectional view of the cooling jacket taken along line indicated by reference character A-A in FIG. 1.
Figure 3:
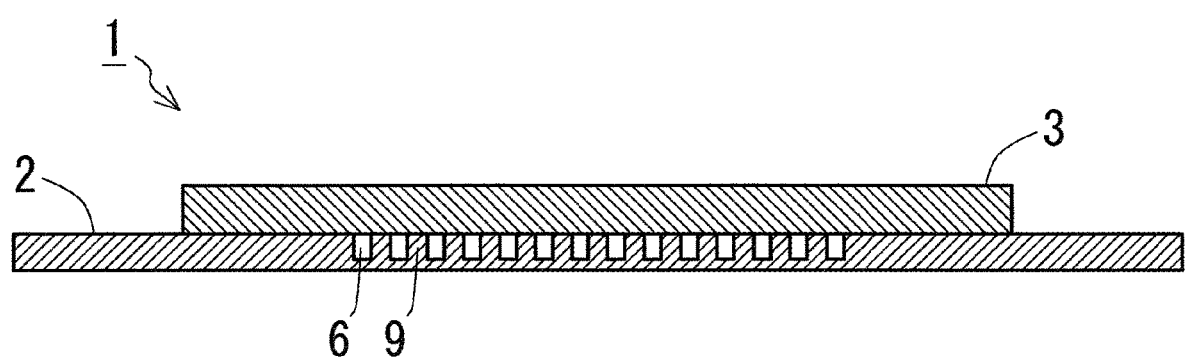
FIG. 3 is a cross-sectional view of the cooling jacket taken along line indicated by reference character B-B in FIGS. 1 and 2.
Figure 4:
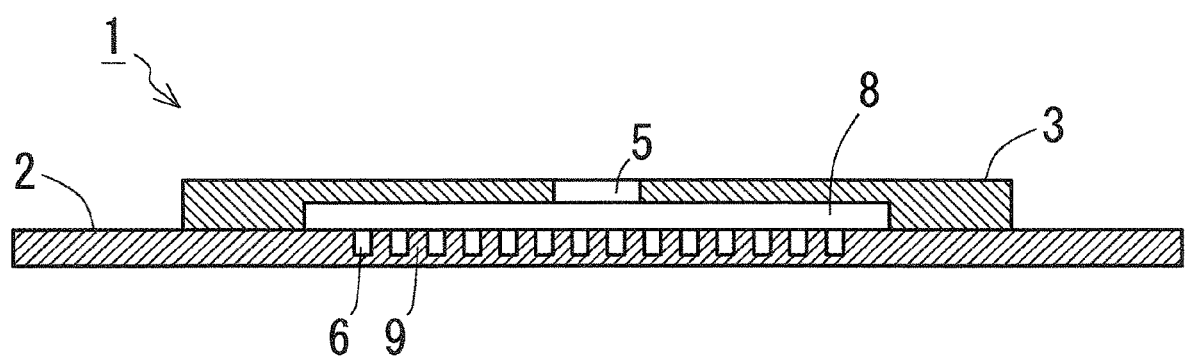
FIG. 4 is a cross-sectional view of the cooling jacket taken along line indicated by reference character C-C in FIGS. 1 and 2.

FIG. 2 is a cross-sectional view of the cooling jacket 1 taken along line indicated by reference character A-A in FIG. 1. In addition, FIG. 3 is a cross-sectional view of the cooling jacket 1 taken along line indicated by reference character B-B in FIGS. 1 and 2. In addition, FIG. 4 is a cross-sectional view of the cooling jacket 1 taken along line indicated by reference character C-C in FIGS. 1 and 2.

The cooling jacket 1 has therein multiple grooves 6 formed on the surface of the base 2. The grooves 6 are provided in the center portion of the base 2 and do not reach the end portion of the base 2. Each of the grooves is arranged in parallel. The cover 3 is a plate-shaped member and is bonded to the surface of the base 2 in a state of covering the grooves 6 formed on the surface of the base 2. Then, the cover 3 is provided in the bonding surface with the base 2 with a recessed coolant supply portion 7 (an example of a "coolant supply portion" mentioned in the present disclosure) which is formed at a position where it covers all of the grooves 6 in a portion at one end side of the grooves 6. In addition, the cover 3 is provided in the bonding surface with the base 2 with a recessed coolant discharge portion 8 (an example of a "coolant discharge portion" mentioned in the present disclosure) which is formed at a position where it covers all of the grooves 6 in a portion at the other end side of the grooves 6. The coolant supply portion 7 communicates with a coolant pipe outside the cooling jacket 1 through the inlet 4. In addition, the coolant discharge portion 8 communicates with a coolant pipe outside the cooling jacket 1 through the outlet 5. Each groove 6 has a curved bottom surface 6B at both ends of the groove 6 which makes the groove 6 gradually shallower than its original state toward the end portion of the groove 6.

As described above, the base 2 is obtained by forming the grooves 6 on the surface of the plate-shaped member. Thus, as illustrated in FIG. 3 or FIG. 4, fins 9 are formed in the base 2 by the grooves 6. Since the fins 9 are formed by forming the grooves 6 on the surface of the base 2, the upper end surface of the fin 9 is on the same plane as the surface of the base 2. Then, since the bonding surface of the cover 3 which is bonded to the surface of the base 2 is flat except a portion in which the coolant supply portion 7 and the coolant discharge portion 8 are provided, when the cover 3 is bonded to the base 2, a portion of the bonding surface of the cover 3 which is sandwiched between the coolant supply portion 7 and the coolant discharge portion 8 comes into contact with the upper end of each fin 9 which is on the same plane as the surface of the base 2. As a result, in the cooling jacket 1, no path is formed from the coolant supply portion 7 to the coolant discharge portion 8 without passing through the grooves 6, so that the coolant introduced into the coolant supply portion 7 needs to pass through the grooves 6 and then reaches the coolant discharge portion 8.

Accordingly, in the cooling jacket 1 having the above inner structure, the coolant introduced into the cooling jacket 1 through the inlet 4 is first introduced into the coolant supply portion 7. Since the coolant supply portion 7 is formed at the position where it covers all of the grooves 6 in the portion at one end side of the grooves 6, the coolant introduced into the coolant supply portion 7 diverges to the respective grooves 6. Since each groove 6 has the curved bottom surface 6B in the end portion thereof, the coolant introduced into the groove 6 from the coolant supply portion 7 smoothly changes the path thereof along the curved bottom surface 6B. Then, since the coolant discharge portion 8 is formed at the position where it covers all of the grooves 6 in the portion at the other end side of the grooves 6, the coolant diverged to the respective grooves 6 again merges in the coolant discharge portion 8. Since each groove 6 has the curved bottom surface 6B in the end portion thereof, the coolant flowing in the groove 6 changes the path thereof along the curved bottom surface 6B in the end portion of the groove 6, and smoothly flows from the groove 6 to the coolant discharge portion 8. The coolant from the respective grooves 6 merged in the coolant discharge portion 8 is discharged to the coolant pipe outside the cooling jacket 1 through the outlet 5.

Since the coolant flows inside the cooling jacket 1 as described above, heat of the heat generating component to which the cooling jacket 1 is attached is transferred to the coolant through the base 2 configured to form a portion that is in contact with the heat generating component. Thus, when the coolant having a temperature lower than that of the heat generating component continues to be continuously introduced into the cooling jacket 1 from the inlet 4, the heat generating component to which the cooling jacket 1 is attached is continuously cooled.

Figure 5:
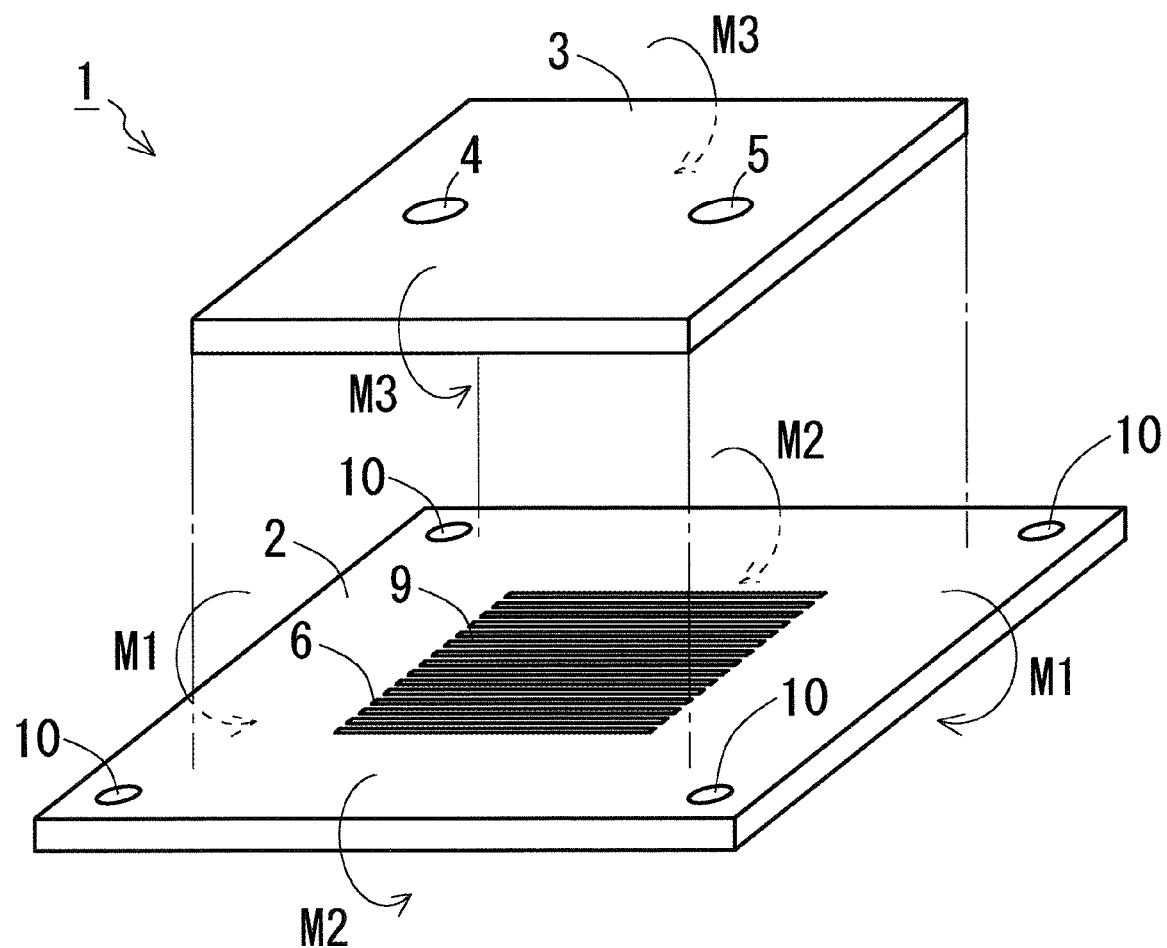
FIG. 5 is a perspective view illustrating the cooling jacket in a disassembled state.

FIG. 5 is a perspective view illustrating the cooling jacket 1 in a disassembled state. As illustrated in FIG. 5, the base 2 used for the cooling jacket 1 is obtained by forming the grooves 6 on the surface of the plate-shaped member. Thus, the upper end surface of each fin 9 is on the same plane as the surface of the base 2. Thus, when the cover 3 is bonded to the base 2, the portion of the bonding surface of the cover 3 which is sandwiched between the coolant supply portion 7 and the coolant discharge portion 8 comes into contact with the upper end of each fin 9 on the same plane as the surface of the base 2.

Next, the structural strength of the cooling jacket 1 will be described.

Figure 6:
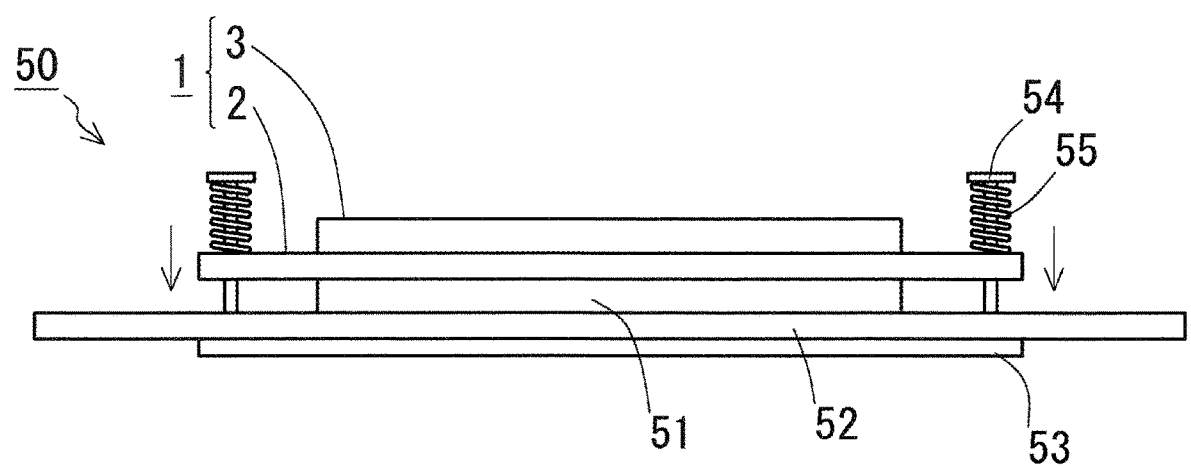
FIG. 6 is a view illustrating an exemplary electronic apparatus using the cooling jacket.

FIG. 6 is a view illustrating an exemplary electronic apparatus using the cooling jacket 1. The electronic apparatus 50 is a printed circuit board 52 on which a heat generating component 51 is mounted or an electronic apparatus including any of various other electronic components. A specific example of the electronic apparatus 50 may be, for example, a server, a personal computer, a communication device, or any of various other electronic apparatuses. In such an electronic apparatus 50, the cooling jacket 1 is attached to, for example, the heat generating component 51 mounted on the printed circuit board 52. The heat generating component 51 may be, for example, a semiconductor package such as, for example, a CPU or a GPU. The cooling jacket 1 is fixed by screws 54 which are inserted through the mounting holes 10 at the four corners of the base 2. The screws 54 are screwed into screw holes in a back plate 53 which is lined on the surface of the printed circuit board 52 opposite to the heat generating component 51.

In addition, the cooling jacket 1 is placed on the heat generating component 51 which is smaller than the base 2 when viewed from the top. Thus, the four corners of the base 2 are in a state of being lifted up from the printed circuit board 52 by the thickness of the heat generating component 51. Then, the four corners of the base 2 are pressed against the printed circuit board 52 side by springs 55 which are inserted around the screws 54. Therefore, a load acting in a direction of bending the base 2 as indicated by reference characters "M1" or "M2" in FIG. 5 is applied to the base 2.

Figure 7:
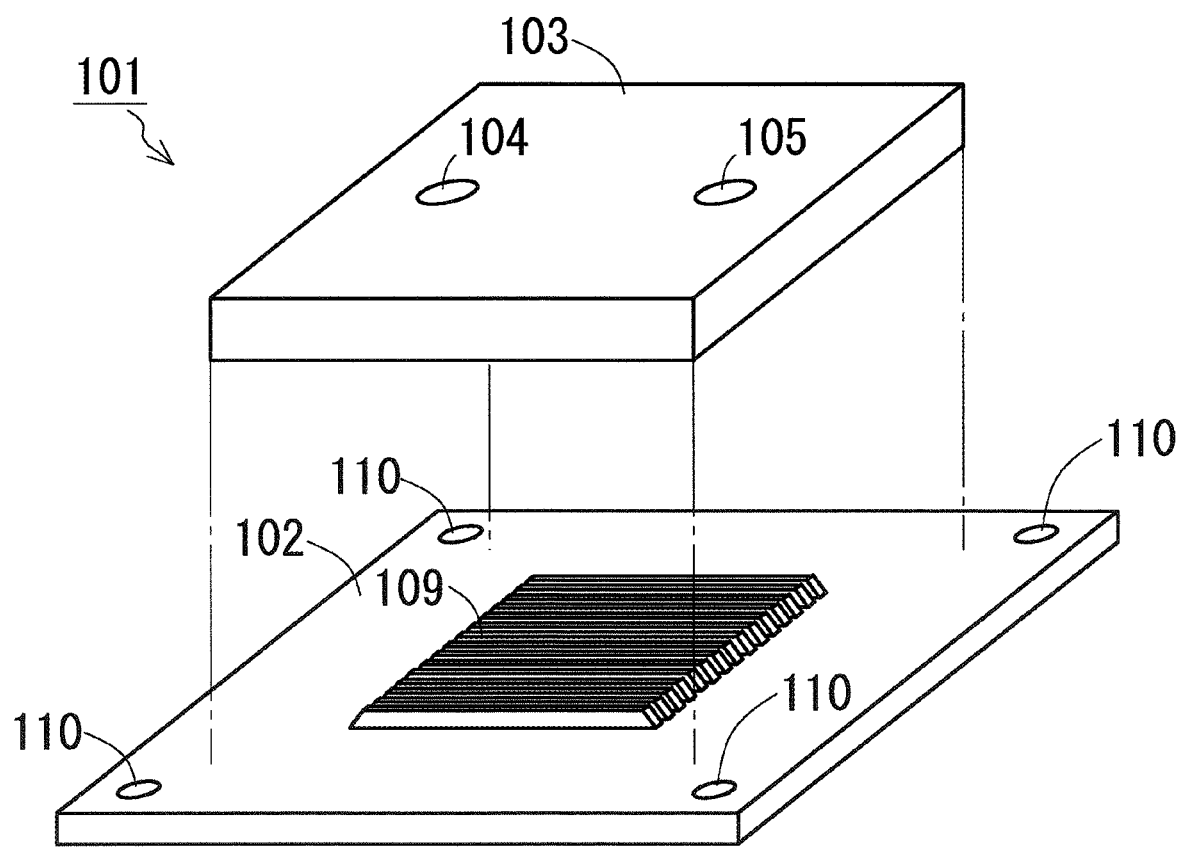
FIG. 7 is a perspective view illustrating a comparative example in a disassembled state.

In order to verify that the cooling jacket 1 is suitable for the mounting state as described above, a comparative example will be described. FIG. 7 is a perspective view illustrating a comparative example in a disassembled state. Since the appearance of the comparative example is almost the same as that of the cooling jacket 1 illustrated in FIG. 1, the illustration thereof is omitted. A cooling jacket 101 of the comparative example includes a plate-shaped base 102 and a plate-shaped cover 103 on the same manner as the cooling jacket 1. Mounting holes 110 are formed at four corners of the base 102 in order to attach the cooling jacket 101 to the heat generating component 51. In addition, the surface of the cover 103 is provided with an inlet 104 and an outlet 105 for connecting coolant pipes. The base 102 is not provided with a groove like the groove 6 formed in the base 2. Then, fins 109 are erected on the surface of the base 102.

Figure 8:
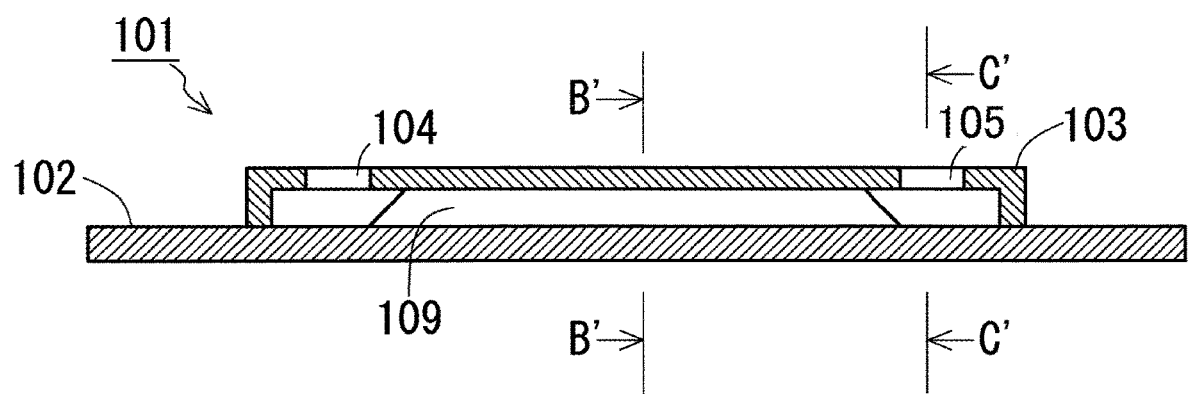
FIG. 8 is a cross-sectional view of a cooling jacket of the comparative example in a portion corresponding to the line indicated by reference character A-A in FIG. 1.
Figure 9:
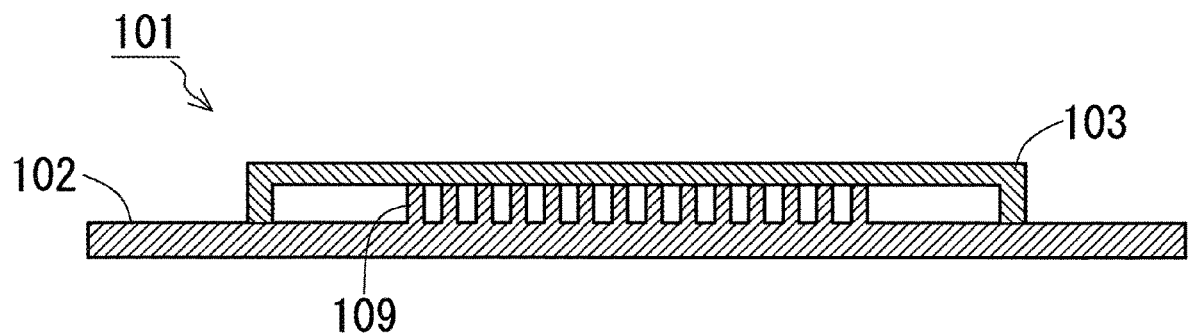
FIG. 9 is a cross-sectional view of the cooling jacket of the comparative example taken along line indicated by reference character B'-B' in FIG. 8.

FIG. 8 is a cross-sectional view of the cooling jacket 101 of the comparative example in a portion corresponding to the line indicated by reference character A-A in FIG. 1. In addition, FIG. 9 is a cross-sectional view of the cooling jacket 101 of the comparative example taken along line indicated by reference character B'-B' in FIG. 8. In addition, FIG. 10 is a cross-sectional view of the cooling jacket 101 of the comparative example taken along line indicated by reference character C'-C' in FIG. 8.

Figure 10:
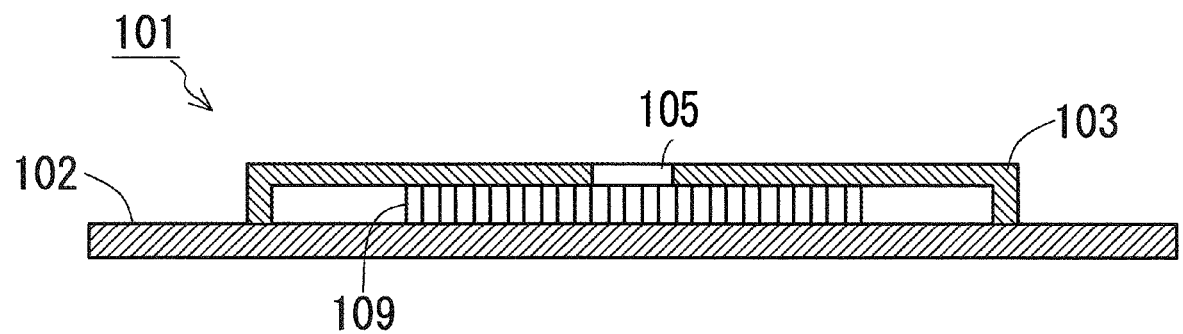
FIG. 10 is a cross-sectional view of the cooling jacket of the comparative example taken along line indicated by reference character C'-C' in FIG. 8.

The cooling jacket 101, as illustrated in FIGS. 8 to 10, has a structure in which the fins 109 are erected in the inner space of the hollow cover 103. Thus, in the cooling jacket 101 having such a structure, the entire base 102 is thinned in order to make a portion in which a liquid coolant circulates and the heat generating component as close as possible. When the entire base 102 is thinned, there is a possibility that the cooling jacket 101 may be insufficient in strength due to the following reasons.

Figure 11A:
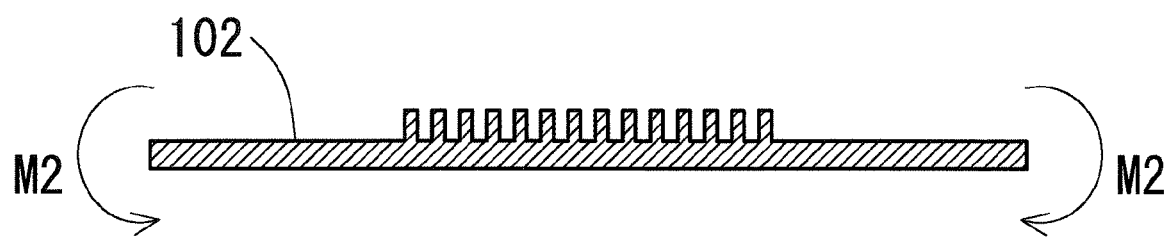
FIGS. 11A to 11C are views illustrating deformation of a base.
Figure 11B:
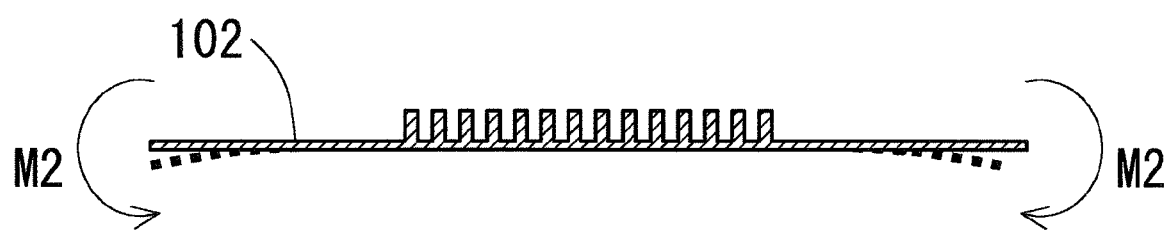
Figure 11C:
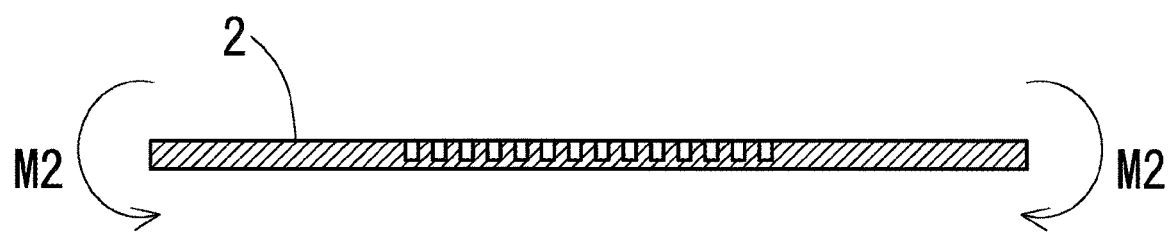

FIGS. 11A to 11C are views illustrating deformation of the base. FIGS. 11A and 11B correspond to the base 102 of the comparative example, and FIG. 11C corresponds to the base 2 of the embodiment. FIG. 11A illustrates the base 102 that is relatively thick. Meanwhile, FIG. 11B illustrates the base 102 that is thinned. In the cooling jacket 101, when the base 102 is thinned in order to make the portion in which the liquid coolant circulates and the heat generating component as close as possible, the entire base 102 is thin. Thus, when the four corners of the base 102 are pressed by the springs 55 by fixing the cooling jacket 101 to the heat generating component 51 using the screws 54, the base 102 which is wholly thin is deformed as illustrated in, for example, FIG. 11B.

In this respect, in the cooling jacket 1 of the embodiment, since the grooves 6 are the portion in which the liquid coolant circulates and the heat generating component 51 are made close to each other by forming the grooves 6 in the base 2 rather than making the entire base 2 be thin, the entire base 2 is not thinned. That is, even if the grooves 6 and the heat generating component 51 are close to each other, the thickness of the entire base 2 is maintained. Thus, for example, even if the four corners of the base 2 are pressed by the springs 55, the base 2 does not easily deform as illustrated in FIG. 11C. Then, with regard to cooling efficiency, since thermal resistance in the base 2 is reduced by reducing the distance between the grooves 6 and the heat generating component 51, the cooling efficiency is enhanced as compared with a case where the distance between the portion in which the liquid coolant circulates and the heat generating component 51 is substantially equal to the thickness of the entire base 2. According to estimation, it has been confirmed that when the distance between the portion in which the liquid coolant circulates and the heat generating component 51 is reduced from 3 mm to 1 mm, the thermal resistance in the base 2 may be reduced by about 20% to 70%, although it depends on the form of the cooling jacket 1 or the heat generating component 51.

In addition, the base 2 is obtained by forming the grooves 6 on the surface of the plate-shaped member. Thus, when a load acting in the direction of bending the base 2 in the end portion of the base 2 in the longitudinal direction of each groove 6 as indicated by reference characters "M1" in FIG. 5 is applied to the base 2, the fin 9 may structurally function as a portion that withstands the load. Meanwhile, when a load acting in the direction of bending the base 2 in the end portion of the base 2 in the transverse direction of each groove 6 as indicated by reference characters "M2" in FIG. 5 is applied to the base 2, the fins 9 may not structurally function as a portion that withstands the load. Thus, when the base 2 is grasped as a single body, it can be said that the strength of the base 2 against the load acting in the direction of bending the base 2 in the end portion of the base 2 in the transverse direction of each groove 6 is relatively weak.

However, the cover 3 is bonded to the base 2. Although the cover 3 is provided with the coolant supply portion 7 and the coolant discharge portion 8, thick portions indicated by reference characters "M" and "S" in FIG. 2 extend from one end to the other end of the cover 3 along the transverse direction of each groove 6. Thus, when a load acting in a direction of bending the cover 3 in the end portion of the cover 3 in the transverse direction of each groove 6 as indicated by reference characters "M3" in FIG. 5 is applied to the cover 3, the thick portions indicated by reference characters "M" and "S" in FIG. 2 may structurally function as a portion that withstands the load.

Thus, the cooling jacket 1 in which the cover 3 is bonded to the base 2 may sufficiently exert the strength required for mounting the cooking jacket 1 to the heat generating component 51.

In addition, the cooling jacket 1 may also be modified, for example, as follows.

Figure 12:
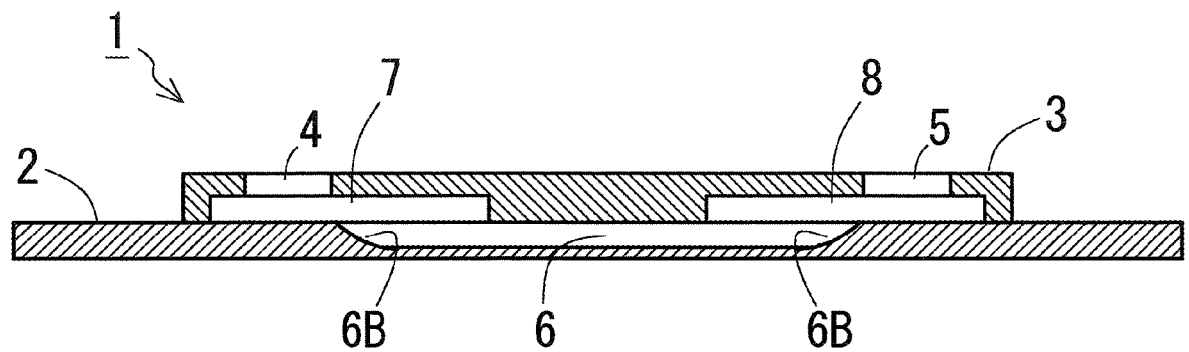
FIG. 12 is a first view illustrating a modification of the cooling jacket.

FIG. 12 is a first view illustrating a modification of the cooling jacket 1. For example, as illustrated in FIG. 12, the cooling jacket 1 may be one in which the position and size of the inlet 4, the outlet 5, the coolant supply portion 7, or the coolant discharge portion 8 are appropriately changed. Even if the position and size of the inlet 4, the outlet 5, the coolant supply portion 7, or the coolant discharge portion 8 are appropriately changed, the portion in which the liquid coolant circulates and the heat generating component 51 may be made close to each other, rather than thinning the entire base 2.

Figure 13:
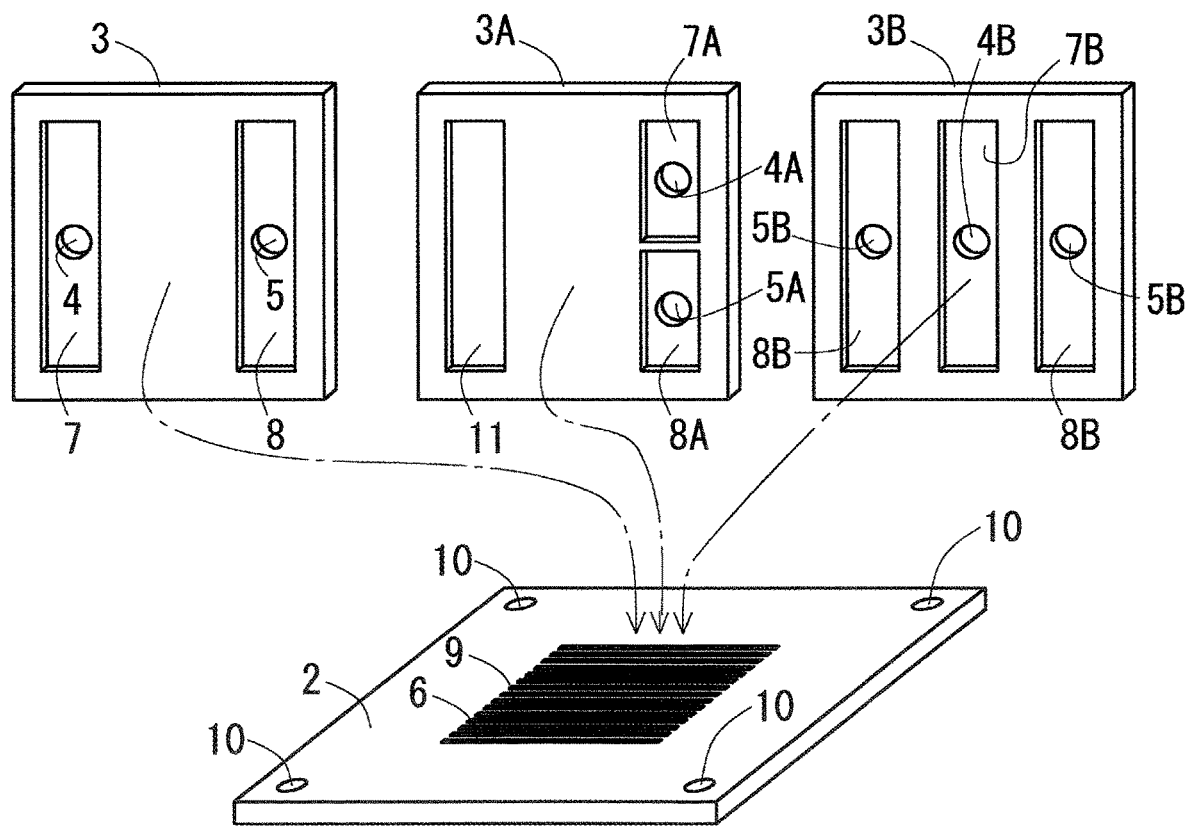
FIG. 13 is a second view illustrating a modification of the cooling jacket.

FIG. 13 is a second view illustrating a modification of the cooling jacket 1. The cover indicated by reference numeral "3" in FIG. 13 corresponds to the above embodiment. Meanwhile, covers indicated by reference numerals "3A" and "3B" in FIG. 13 are modifications of the cover 3 according to the embodiment.

For example, similar to the cover 3A illustrated in FIG. 13, the cover 3 may be modified in a manner such that both a coolant supply portion 7A and a coolant discharge portion 8A are disposed at one end side of the grooves 6 and a coolant relay portion 11 is disposed at the other end side of the grooves 6. In a case of the cooling jacket 1 in which such a cover 3A is bonded to the base 2, the coolant introduced into the coolant supply portion 7A from the inlet 4 diverges to one side half of the plurality of grooves 6 and then merges in the coolant relay portion 11, and thereafter diverges to the other grooves 6 and then merges in the coolant discharge portion 8A, and follows a path along which it is discharged from the outlet 5A.

In addition, for example, as in the cover 3B illustrated in FIG. 13, the cover 3 may be modified in a manner such that, in addition to two recessed coolant discharge portions 8B and 8B formed at positions where they cover all of the grooves 6 at both ends of the grooves 6, a recessed coolant supply portion 7B is formed at a position where it covers all of the grooves 6 in the center portion of the grooves 6. In a case of the cooling jacket 1 in which the cover 3B is bonded to the base 2, the coolant introduced into the coolant supply portion 7B from an inlet 4B diverges to all of the grooves 6 in the center portion of the grooves 6. The coolant diverged to the grooves 6 is divided into two directions of a stream toward one end side of the grooves 6 and a stream toward the other end side of the grooves 6. Then, the respective coolant streams toward one end side and the other end side of the grooves 6 merge in the coolant discharge portions 8B and follow a path along which they are discharged from outlets 5B.

Even if the cover 3A or the cover 3B described above is bonded to the base 2 instead of the cover 3, the cooling jacket 1 may maintain the thickness of the base 2 while causing the portion in which the coolant circulates and the heat generating component 51 to be close to each other in the same manner as that in which the cover 3 is bonded to the base 2.

Figure 14:
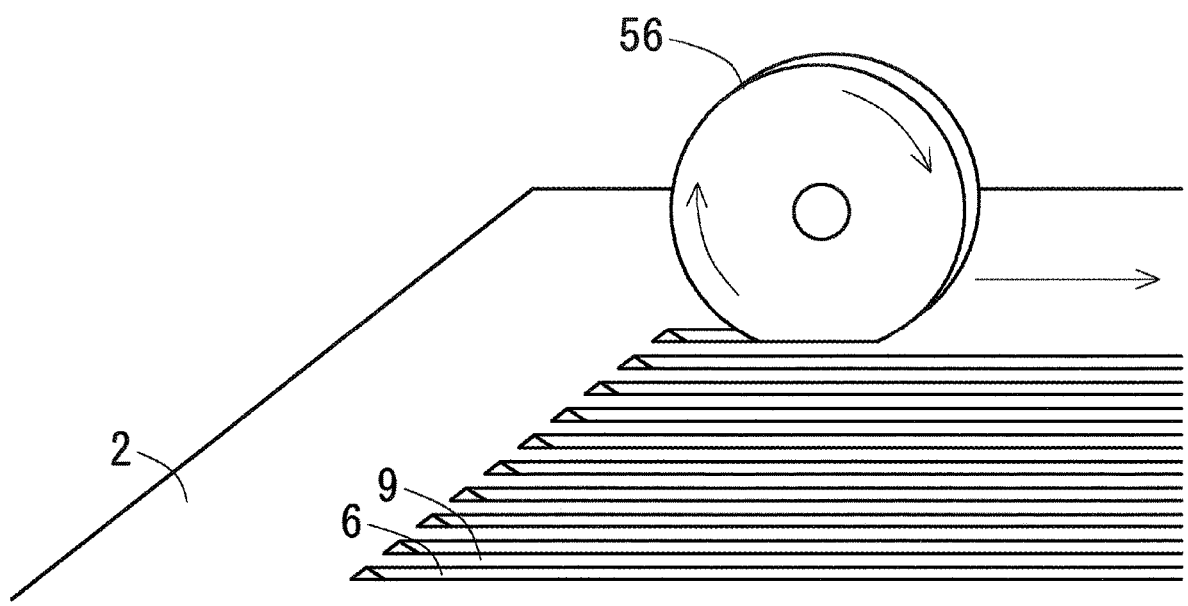
FIG. 14 is a view illustrating an exemplary method of processing a groove.

FIG. 14 is a view illustrating an exemplary method of processing the groove 6. The groove 6 may be formed, for example, by making a cut in a flat plate as a raw material of the base 2 using a disk-shaped saw 56. When the groove 6 is formed using the saw 56, the groove 6 has the curved bottom surface 6B having a constant radius of curvature that is equal to the radius of the saw 56 at both ends of the groove 6. By forming the curved bottom surface 6B at both ends of the groove 6, the smooth flow of the coolant which is introduced into and discharged from the groove 6 is realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling jacket comprising:
 a base configured to have a portion that is in contact with a heat generating component;
 a plurality of grooves formed on a surface of the base, each of the plurality of grooves being configured to:
  be arranged in parallel with each other,
  have curved bottom surfaces provided in both end portions thereof in a longitudinal direction, and
  be shallower toward the both end portions thereof; and
 a cover configured to:
  be in contact with an upper end of each of fins formed by the plurality of grooves on the same plane as the surface of the base, and
  be bonded to the base in a state of covering all of the plurality of grooves,
 the cover includes:
  a recessed coolant supply portion formed at a position where the recessed coolant supply portion covers all of the plurality of grooves in a portion at one end side of the plurality of grooves; and
  a recessed coolant discharge portion formed at a position where the recessed coolant discharge portion covers all of the plurality of grooves in a portion at other end side of the plurality of grooves.

2. The cooling jacket according to claim 1, wherein each of the curved bottom surfaces is a curved surface having a constant radius of curvature.

3. The cooling jacket according to claim 1, wherein the base includes mounting holes at corners thereof for attachment to the heat generating component.

4. An electronic apparatus comprising:
 a heat generating component;
 a cooling jacket attached to the heat generating component, the cooling jacket including:
 a base configured to form a portion that is in contact with the heat generating component;
 a plurality of grooves formed on a surface of the base, each of the plurality of grooves being configured to:
  be arranged in parallel each other,
  have curved bottom surfaces provided in both end portions thereof in a longitudinal direction, and
  be shallower toward the both end portions thereof; and
 a cover configured to:
  be in contact with an upper end of each of fins formed by the plurality of grooves on the same plane as the surface of the base, and
  be bonded to the base in a state of covering all of the plurality of grooves,
 the cover includes:
  a recessed coolant supply portion formed at a position where the recessed coolant supply portion covers all of the grooves in a portion at one end side of the plurality of grooves, and
  a recessed coolant discharge portion formed at a position where the recessed coolant discharge portion covers all of the grooves in a portion at other end side of the plurality of grooves.

5. The electronic apparatus according to claim 4, wherein each of the curved bottom surfaces is a curved surface having a constant radius of curvature.

6. The electronic apparatus according to claim 4, wherein the base includes mounting holes at corners thereof for attachment to the heat generating component.

* * * * *